United States Patent
Jain et al.

(10) Patent No.: US 9,000,529 B1
(45) Date of Patent: Apr. 7, 2015

(54) REDUCTION OF SINGLE EVENT UPSETS WITHIN A SEMICONDUCTOR INTEGRATED CIRCUIT

(71) Applicant: Xilinx, Inc., San Jose, CA (US)

(72) Inventors: Praful Jain, Ghaziabad (IN); James Karp, Saratoga, CA (US); Michael J. Hart, Palo Alto, CA (US); Ramakrishna K. Tanikella, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 126 days.

(21) Appl. No.: 13/666,159

(22) Filed: Nov. 1, 2012

(51) Int. Cl.
*H01L 21/70* (2006.01)
*H01L 29/06* (2006.01)

(52) U.S. Cl.
CPC .................................. *H01L 29/0646* (2013.01)

(58) Field of Classification Search
USPC .......................................... 257/369, E27.062
See application file for complete search history.

(56) References Cited

U.S. PATENT DOCUMENTS

| | | | | |
|---|---|---|---|---|
| 2010/0157669 | A1* | 6/2010 | Audzeyeu et al. | 365/185.1 |
| 2011/0175197 | A1* | 7/2011 | Furuta | 257/544 |
| 2012/0180005 | A1* | 7/2012 | Lilja | 716/50 |
| 2014/0048887 | A1* | 2/2014 | Hart et al. | 257/369 |

OTHER PUBLICATIONS

Chatterjee, Indranil et al., Single-Event Charge Collection and Upset in 40-nm Dual- and Triple- Well Bulk CMOS SRAMs, *IEEE Transactions on Nuclear Science*, Dec. 2011, vol. 58, No. 6, IEEE, Piscataway, New Jersey, USA.

* cited by examiner

*Primary Examiner* — Trung Q Dang
(74) *Attorney, Agent, or Firm* — Kevin T. Cuenot

(57) ABSTRACT

A circuit includes a complimentary metal-oxide semiconductor (CMOS) storage element implemented within a p-type substrate and an n-well implemented within the p-type substrate that is independent of the storage element. The n-well and the storage element are separated by a minimum distance in which the p-type substrate includes no n-well.

18 Claims, 2 Drawing Sheets

REDUCTION OF SINGLE EVENT UPSETS WITHIN A SEMICONDUCTOR INTEGRATED CIRCUIT

TECHNICAL FIELD

One or more embodiments disclosed within this specification relate to reducing the occurrence of single event upsets within a semiconductor integrated circuit.

BACKGROUND

A single event upset (SEU) is a change of state induced within a micro-electronic device such as a microprocessor, a semiconductor memory, or the like. In general, SEUs are caused by particles or electro-magnetic radiation striking a node in the micro-electronic device. Because the affected device is not permanently damaged, SEUs are considered non-destructive events. Only the output (signal) of the affected device is altered. Correspondingly, several changes of state induced within devices can be referred to as a multiple bit upset (MBU).

As feature sizes of devices continue to decrease, the rate of occurrence of MBUs has increased, thereby increasing SEUs manifold. Some conventional techniques for mitigating the effects of SEUs are architectural. Examples of architectural techniques include redundancy, triplication, use of error code correction, or the like. Other techniques are process level techniques such as the use of Silicon On Insulator (SOI) technology. These techniques, both architectural and process level, often require significant area and impose performance penalties on the circuitry.

SUMMARY

A circuit includes a complimentary metal-oxide semiconductor (CMOS) storage element implemented within a p-type substrate and an n-well implemented within the p-type substrate that is independent of the storage element. The n-well and the storage element are separated by a minimum distance in which the p-type substrate includes no n-well.

A semiconductor integrated circuit includes a p-type substrate, a CMOS storage element implemented within the p-type substrate, and an n-well. The n-well is implemented within the p-type substrate and is independent of the storage element. The n-well and the storage element are separated by a minimum distance in which the p-type substrate includes no n-well.

A method of designing a semiconductor integrated circuit includes identifying a CMOS storage element implemented within a p-type substrate within a circuit design, selecting an n-well within the p-type substrate that is closest to the storage element and independent of the storage element, and measuring a distance between the n-well and the storage element using a processor. The method further includes comparing the distance with a minimum distance and indicating whether a design rule is violated according to comparing the distance with the minimum distance.

DETAILED DESCRIPTION

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

This specification relates to reducing the occurrence of single event upsets (SEUs) within semiconductor integrated circuits (ICs). In accordance with the inventive arrangements disclosed within this specification, one or more layout techniques can be used when designing circuitry to be implemented within a semiconductor IC that reduce susceptibility of the resulting IC to SEUs. Susceptibility of the resulting IC and, more particularly, to storage elements implemented within the IC, can be reduced through application of layout design rules relating to the size and placement of N-wells in and around storage elements. The design rules improve the resistance of the storage element to SEUs within the semiconductor IC while avoiding area and performance penalties typically incurred when using other conventional SEU mitigation techniques.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
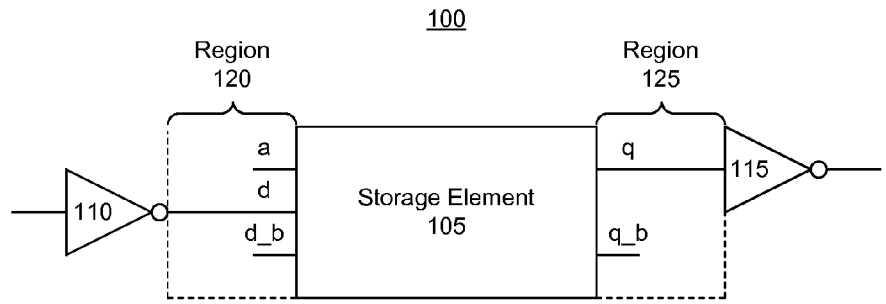
FIG. 1 is a first block diagram showing an exemplary circuit with increased resistance to single event upsets (SEUs).

FIG. 1 is a first block diagram showing an exemplary circuit 100 with increased resistance to SEUs. Circuit 100 includes a storage element 105 and inverters 110 and 115. Storage element 105 can be implemented in the form of a memory cell, a flip-flop, or the like. A non-exhaustive list of memory cells includes 6T-SRAM (6 transistor static random access memory) and 8T-Dual-Port-SRAM.

Circuit 100 is implemented within a semiconductor IC using Complementary Metal-Oxide Semiconductor (CMOS) technology. Accordingly, storage element 105 and inverters 110 and 115 each includes both a p-type MOS (PMOS) transistor, e.g., a CMOS field effect transistor or MOSFET) and an n-type MOS (NMOS) transistor. For purposes of illustration, it can be assumed that a p-type substrate is used. As such, NMOS transistors are formed within a p-well implemented within the p-type substrate. PMOS transistors are formed within an n-well implemented within the p-type substrate.

As shown, a region 120 is defined that separates inverter 110 from storage element 105. A region 125 is defined that separates inverter 115 from storage element 105. Regions 120 and 125 can be designed in accordance with one or more design rules that dictate attributes such as sizing of n-wells in relation to storage element 105, placement of n-wells around storage element 105, and use of other circuit elements within regions 120 and 125. The design rules are applied during the layout process and/or during a layout checking or validation process for circuit 100, e.g., a programmatic description of circuit 100, by an electronic design automation (EDA) tool.

A "layout" of a semiconductor IC refers to the representation of the IC as a collection of one or more planar geometric shapes that correspond to the patterns of metal, oxide, and/or other semiconductor layers that form the circuit elements (or components) of the IC. "Design Rule Checking" or "DRC" refers to the process of determining whether the physical layout of a particular semiconductor IC, or portion thereof, satisfies a series of recommended parameters called "design rules."

A common practice in circuit layout is to locate as many CMOS transistors together as possible to efficiently utilize area. This means that PMOS transistors needed to implement one or more different components are grouped together, resulting in larger n-wells. The larger n-wells, typically being located close to storage elements, result in higher susceptibility of the storage elements to SEUs. For example, referring to circuit 100, locating inverters 110 and 115 close to storage element 105 may entail locating the n-well needed for the PMOS transistors of inverters 110 and 115 (and other devices not shown) near storage element 105. In some cases, the same n-well may be used for the PMOS transistors of inverter 110, 115, and/or storage element 105.

Particle strikes to n-wells within semiconductor ICs, however, lead to the drifting of excess holes. The excess holes are generated post-strike and drift across a reverse biased n-well/p-well junction into the p-well. The excess electrons remain in the n-well. This effect causes the substrate-source junction of the NMOS transistors of the storage element, e.g., storage element 105, within the p-well to become forward biased.

When traveling from the source to the substrate, the electrons are collected by the reverse biased drain junction of the NMOS transistors of the storage element. This effect is referred to as the "parasitic bi-polar junction transistor (BJT)" effect. The parasitic BJT effect can influence many storage elements at least partially implemented in the p-well simultaneously, leading to multi-bit upsets (MBUs).

Sensitivity of a storage element to SEU generally refers to the size of the area of the storage element in which a particle strike may cause the SEU. This sensitivity increases with the area of n-wells. A linear relationship between the area of the n-well adjacent to the storage element and sensitivity of the storage element to SEUs is observable. When the n-well is implemented a larger distance from the storage element, the separation of excess charge still takes place, but the parasitic BJT effect does not occur within storage element NMOS transistors.

Referring to FIG. 1, inverters 110 and 115 have been used for purposes of illustration only. It should be appreciated that any of a variety of CMOS circuit elements that include PMOS transistors can be used to illustrate sizing and/or placement conditions relating to n-wells. A non-exhaustive list of other CMOS circuit elements that utilize PMOS transistors and, as such, n-wells, includes NAND gates, AND gates, OR gates, etc.

Figure 2:
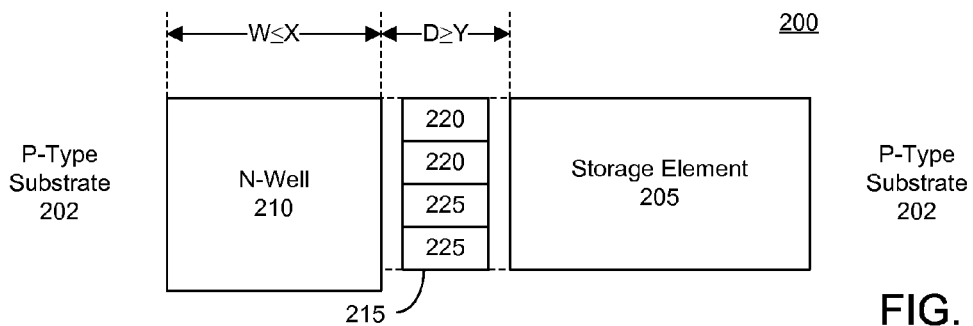
FIG. 2 is a second block diagram showing an exemplary layout of a circuit with increased resistance to SEUs.

FIG. 2 is a second block diagram showing an exemplary layout of a circuit 200 with increased resistance to SEUs. Circuit 200 includes a storage element 205, e.g., a flip-flop or a memory cell, and an n-well 210. Storage element 205 and n-well 210 are implemented within a p-type substrate 202 of a semiconductor IC. N-well 210 is independent of storage element 205 meaning that n-well 210 is separate from any n-well of storage element 205 and does not include any PMOS transistors that are used in implementing storage element 205.

N-well 210 has a width of "W." Further, n-well 210 is separated from storage element 205 by a distance of "D." One exemplary design rule for increasing resistance of a storage element to an SEU is that D, representing the distance from storage element 205 to an n-well must be greater than or equal to a minimum distance "Y." The distance is measured from a closest edge or boundary of n-well 210 to a closest boundary of storage element 205. In one aspect, the boundary of storage element 205 is the boundary of an NMOS transistor used in the storage element that is closest to n-well 210. In another aspect, the boundary of storage element 210 is a boundary of an n-well used within storage element 205 that is closest to n-well 210. Accordingly, a portion of the p-type substrate 202 that exists between storage element 205 and n-well 210 as represented by region 215 is devoid, i.e., does not include, an n-well. Using a 28 nanometer IC process technology for purposes of illustration, the value of Y can be set equal to 0.75 microns, or approximately 0.75 microns. Other exemplary values of Y can be set to 0.8, 0.9, 1.0 microns or the like, each providing a certain varying level of improvement (reduction) in SEU occurrence.

Another exemplary design rule is that W must be less than or equal to a maximum width of "X" for an n-well located adjacent to a storage element. Referring again to a 28 nanometer IC process technology, the value of X can be set equal to, or approximately equal to, 0.3 microns. In some cases, adjacency is defined as n-well 210 being located next to storage element 205 without any intervening circuit elements located between, e.g., immediately next to storage element 205. In other cases, adjacency is defined as n-well 210 being located a distance D from storage element 205 that is less than some predetermined distance such as Y and without any intervening circuit elements.

Another exemplary design rule is that one or more mitigating circuit elements are to be included between n-well 210 and storage element 205. Examples of mitigating circuit elements include, but are not limited to, p-type substrate taps (PTAPs) 220 and/or NMOS transistors 225. As known, a PTAP refers to a tap that is connected to a negative voltage supply, e.g., ground, to properly bias p-type substrate 202 for correct operation of the devices implemented therein. PTAPs 220 can be configured to have at least a minimum width. An exemplary minimum width for each of PTAPs 220 is 0.2 microns or approximately 0.2 microns. Typically, several, e.g., 2-3, NMOS transistors 225 can be located within a 1 micron portion of p-type substrate (e.g., where D is approximately equal to 1 micron).

In one aspect, the design rule requiring one or more mitigating circuit elements also specifies that at least a minimum area of the p-type substrate between n-well 210 and storage element 205 must include or be occupied by mitigating circuit elements. For example, a minimum area of region 215 should be occupied by one or more PTAP(s), or one or more NMOS transistor(s), or some combination of both PTAP(s) and NMOS transistor(s). As an illustrative example, at least 50% of region 215 must be occupied by PTAP(s), NMOS transistor(s), or some combination of the two types of mitigating circuit elements. This leaves 50% or less of region 215 as unused p-type substrate, i.e., p-type substrate in which no circuit element or structure is implemented.

The different and specific values of X and Y disclosed above are provided for purposes of illustration only. In some cases, other values either above or below may be used depending upon the combination of design rules that are applied. For example, a larger value of X may be used for larger values of Y. In another example, a larger value of X may be used if PTAPs and/or NMOS transistors are incorporated in region 215 as described. Similarly, the 50% threshold for usage of region 215 can be varied, e.g., either increased or decreased.

It should be appreciated that the actual distances and percentage of region 215 occupied by mitigating circuit elements will vary according to the particular IC manufacturing process that is used. The values for X and Y, for example, will differ across IC manufacturing processes due to variation in parameters including, but not limited to, doping values of the n-well and p-type substrate, design of the storage element itself for each manufacturing process node, layout of the storage element, etc. that occur from one IC manufacturing process to another.

In general, the failure-in-time (FIT) that is attributable to SEUs is highest with large n-wells adjacent to storage elements. The FIT is reduced when small n-wells (e.g., W≤X) are adjacent to the storage element. The FIT is further reduced, e.g., smallest, when no n-well is adjacent to the storage element. The case in which no n-well is adjacent to the storage element is illustrated by the usage of mitigating circuit elements within region 215 as described, in which case the area percentages may be applied.

The various design rules illustrated with respect to FIG. 2 can be extended to the case where n-well 210 is replicated in a column structure and storage element 205 is replicated in a column structure. In that case, region 215 will extend between the column of n-wells and the column of storage elements, with the requirements for Y and any area requirements still being applicable.

As pictured, the top and bottom boundaries of region 215 are aligned with the top and bottom boundaries, respectively, of storage element 205 for purposes of calculating area. Thus, for example, when n-well 210 extends below storage element 205 as pictured (and/or above as the case may be), the bottom boundary of region 215 is aligned with, and determined by, the bottom boundary of storage element 205. The top boundary of region 215 is aligned with, and determined by, the top boundary of storage element 205.

While FIG. 2 shows a layout relation between a single n-well 210 and storage element 205, it should be appreciated that the design rules described within this specification can be applied to n-wells that may be located above, below, and to the right of storage element 205. Accordingly, it should be appreciated that when evaluating an n-well above or below storage element 205, the D and Y parameters will correspond to the height of the region (a region such as region 215) between storage element 205 and the n-well, e.g., the vertical distance between the n-well and storage element 205. In that case, the width of the region will be defined by the left and right edges or boundaries of storage element 205.

Figure 3:
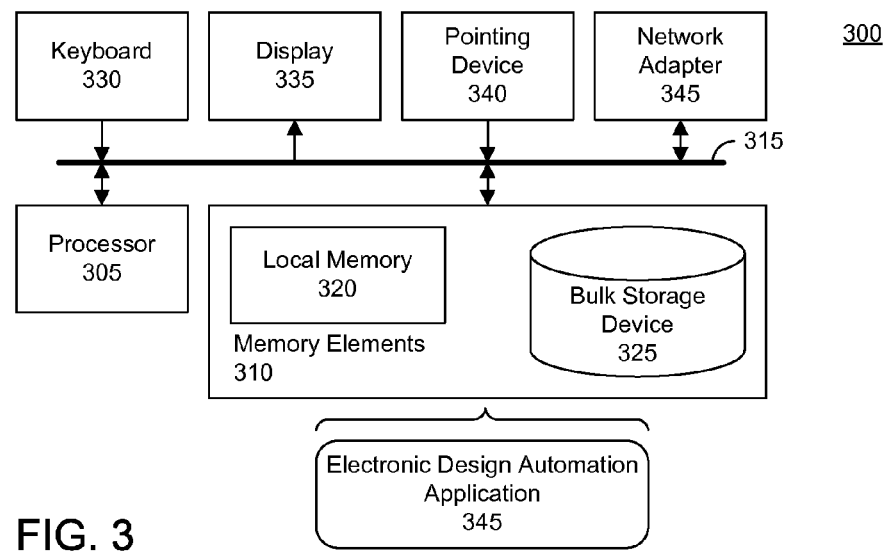
FIG. 3 is a third block diagram illustrating an exemplary electronic design automation tool.

FIG. 3 is a third block diagram illustrating an exemplary EDA tool 300. EDA tool 300 includes at least one processor 305, e.g., a central processing unit, coupled to memory elements 310 through a system bus 315 or other suitable circuitry. EDA tool 300 stores program code such as an operating system and/or application software such as EDA application 345 within memory elements 310. Processor 305 executes the program code accessed from memory elements 310 via system bus 315.

In one aspect, for example, EDA tool 300 is implemented as a computer or other programmable data processing apparatus that is suitable for storing and/or executing program code. It should be appreciated, however, that EDA tool 300 can be implemented in the form of any system including a processor and memory that is capable of performing the functions described within this specification.

Memory elements 310 can include one or more physical memory devices such as, for example, local memory 320 and one or more bulk storage devices 325. Local memory 320 refers to random access memory or other non-persistent memory device(s) generally used during actual execution of the program code. Bulk storage device(s) 325 can be implemented as a hard drive or other persistent data storage device. EDA tool 300 also can include one or more cache memories (not shown) that provide temporary storage of at least some program code in order to reduce the number of times program code must be retrieved from bulk storage device 325 during execution.

Input/output (I/O) devices such as a keyboard 330, a display 335, and a pointing device 340 optionally can be coupled to EDA tool 300. The I/O devices can be coupled to EDA tool 300 either directly or through intervening I/O controllers. A network adapter 345 also can be coupled to EDA tool 300 to enable EDA tool 300 to become coupled to other systems, computer systems, remote printers, and/or remote storage devices through intervening private or public networks. Modems, cable modems, and Ethernet cards are examples of different types of network adapter 345 that can be used with EDA tool 300.

As pictured in FIG. 3, memory elements 310 store an EDA application 345. EDA application 345, being implemented in the form of executable program code, is executed by EDA tool 300 and, as such, is considered an integrated part of EDA tool 300. Accordingly, EDA tool 300 can receive, as input, or operate upon, a programmatic description of a circuit design that includes layout information. EDA tool 300 analyzes the circuit design to check for violation of any design rules as described within this specification as well as any other design rules that may be applicable.

Figure 4:
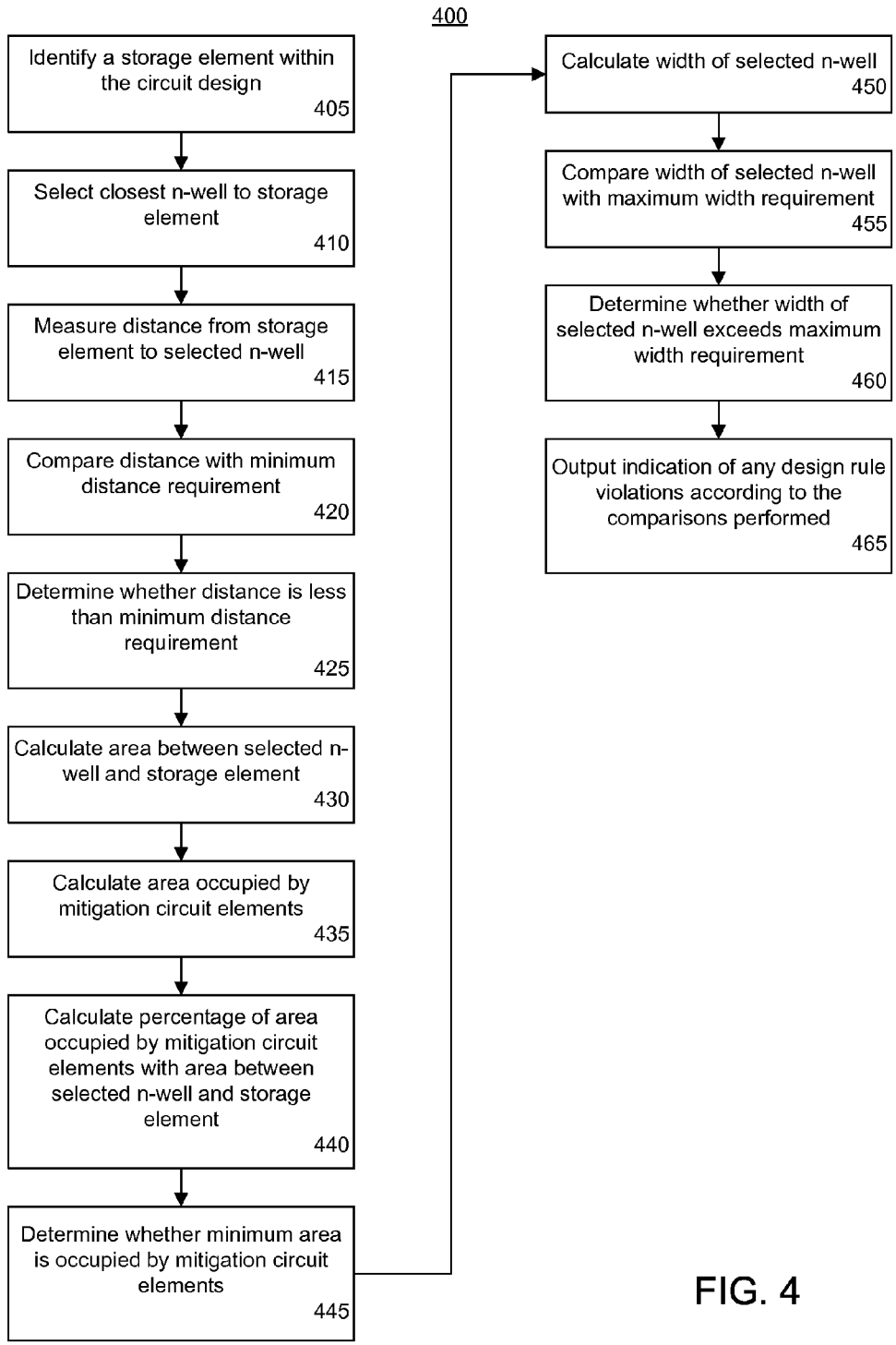
FIG. 4 is a flow chart illustrating an exemplary method of designing a semiconductor integrated circuit.

FIG. 4 is a flow chart illustrating an exemplary method 400 of designing a semiconductor IC. More particularly, FIG. 4 illustrates a method of analyzing a programmatic description of a circuit design that includes layout information in order to determine whether the circuit design complies with one or more design rules that, when observed, increase resistance of the circuit design and the resulting semiconductor IC to SEUs. FIG. 4 is performed by an EDA tool as described with reference to FIG. 3, for example. As such, method 400 begins in a state in which a layout, e.g., layout information for a circuit design, for implementation on or within a semiconductor IC is being evaluated.

In block 405, the EDA tool identifies a storage element within the circuit design. In block 410, the EDA tool selects the closest n-well to the storage element. In block 415, the EDA tool measures the distance from the storage element to the selected n-well. In block 420, the EDA tool compares the distance with a minimum distance requirement. In block 425, the EDA tool determines whether the distance between the storage element and the selected n-well is less than the minimum distance requirement.

In block 430, the EDA tool calculates the area of a region of p-type substrate between the selected n-well and storage element. In block 435, the EDA tool calculates the area occupied by mitigating circuit elements. As discussed, a mitigating circuit element is a PTAP or an NMOS transistor. In block 440, the EDA tool calculates a percentage of the area that is occupied by the mitigating circuit elements, if any. In block 445, the EDA tool determines whether a minimum area of the region, e.g., a minimum percentage of the area of the region, is occupied by mitigating circuit elements.

In block 450, the EDA tool calculates a width of the selected n-well. In block 455, the EDA tool compares the width of the selected n-well with a maximum width requirement for n-wells. In one aspect, the maximum width requirement is one that is specific for n-wells that are located within a predetermined distance of a storage element and not applicable to n-wells located more than the predetermined distance from a storage element. In block 460, the EDA tool determines whether the width of the selected n-well exceeds the maximum width requirement.

In block 465, the EDA tool outputs an indication of any design rule violations. It should be appreciated that the indication or notification provided by the EDA tool can vary according to the particular implementation and inter-dependency of the design rules. As used herein, "outputting" and/or "output" means writing to a file, writing to a user display or other output device, storing in memory, playing audible notifications, sending or transmitting to another system, exporting, or the like.

In one example, the EDA tool only evaluates the width (W) of the n-well against the width requirement (X) when the distance (D) between the n-well and the storage element is less than the minimum distance requirement (Y) and/or when less than the minimum area of the region of p-type substrate between the n-well and the storage element is occupied by mitigating circuit elements. In another example, when any of the comparisons result in a requirement being violated or not met, the EDA tool can output an indication of a design rule violation.

In still another example, a different width requirement (X) can be used for cases in which the n-well is adjacent to the storage element than when the n-well is not adjacent to the storage element. In other examples, the value of X can be scaled according to the distance between the n-well and the storage element when no mitigating circuit elements are present in the region separating the n-well from the storage element.

In another aspect, the user of the EDA tool can specify a desired level of mitigation for SEUs that is to be achieved. In that case, the particular design rules and/or combinations of the design rules that are applied can vary in accordance with the specified level of mitigation desired.

Method 400, as illustrated in FIG. 4, is described with reference to an n-well that is closest to the storage element. It should be appreciated that the methodology described can be repeated for one or more additional n-wells that are located near the storage element, e.g., above, below, to the left, or to the right. Method 400 can iterate, for example, for any n-wells found within a predetermined area surrounding, or distance from, the storage element. In addition, the method 400 can be iterated for additional storage elements or groups of storage elements within the circuit design.

The techniques described with reference to method 400 can be performed in real time as a designer creates or works on a layout for a circuit to prevent design rule violations, or can be applied to an existing layout to identify design rule violations. The phrase "real time" means a level of processing responsiveness that a user or system senses as sufficiently immediate for a particular process or determination to be made, or that enables the processor to keep up with some external process.

For purposes of explanation, specific nomenclature is set forth to provide a thorough understanding of the various inventive concepts disclosed herein. The terminology used herein, however, is for the purpose of describing particular features only and is not intended to be limiting. For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Certain features can be realized in hardware or a combination of hardware and software. As such, one or more features can be realized in a centralized fashion in one system or in a distributed fashion where different elements are spread across several interconnected systems.

One or more features further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system including a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various features disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this specification, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

The various features disclosed within this specification can be embodied in other forms without departing from the essential attributes thereof. Accordingly, reference should be made to the following claims, rather than to the foregoing specification, as indicating the scope of the features described.

What is claimed is:

1. A circuit, comprising:
a complimentary metal-oxide semiconductor (CMOS) storage element implemented within a p-type substrate; and
an n-well implemented within the p-type substrate that is independent of the storage element;
wherein the n-well and the storage element are separated by a minimum distance in which the p-type substrate includes no n-well;
wherein the n-well is separated from the storage element by a region of the p-type substrate; and
wherein the circuit further comprises at least one mitigating circuit element within the region.

2. The circuit of claim 1, wherein the storage element comprises a flip-flop.

3. The circuit of claim 1, wherein the storage element comprises a memory cell.

4. The circuit of claim 1, wherein the n-well has a width that is less than a maximum width.

5. The circuit of claim 1, wherein the region has an area and at least a minimum percentage of the area is occupied by the at least one mitigating circuit element.

6. The circuit of claim 5, wherein the mitigating circuit element comprises a p-type substrate tap.

7. The circuit of claim 5, wherein the mitigating circuit element comprises an n-type MOS transistor.

8. A semiconductor integrated circuit, comprising:
a p-type substrate;
a complimentary metal-oxide semiconductor (CMOS) storage element implemented within the p-type substrate; and
an n-well implemented within the p-type substrate that is independent of the storage element;
wherein the n-well and the storage element are separated by a minimum distance in which the p-type substrate includes no n-well;
wherein the n-well is separated from the storage element by a region of the p-type substrate; and
wherein the circuit further comprises at least one mitigating circuit element within the region.

9. The semiconductor integrated circuit of claim 8, wherein the storage element comprises a flip-flop or a memory cell.

10. The semiconductor integrated circuit of claim 8, wherein the n-well has a width that is less than a maximum width.

11. The semiconductor integrated circuit of claim 8, wherein the region has an area and at least a minimum percentage of the area is occupied by the at least one mitigating circuit element.

12. The semiconductor integrated circuit of claim 11, wherein the mitigating circuit element comprises a p-type substrate tap.

13. The semiconductor integrated circuit of claim 12, wherein the mitigating circuit element comprises an n-type MOS transistor.

14. A method of circuit design layout, comprising:
identifying a complimentary metal-oxide semiconductor (CMOS) storage element implemented within a p-type substrate within a circuit design;
selecting an n-well within the p-type substrate that is closest to the storage element and independent of the storage element;
determining, using a processor, whether the n-well and the storage element are separated by a minimum distance in which the p-type substrate includes no n-well;
wherein the n-well is separated from the storage element by a region of the p-type substrate;
wherein the region includes at least one mitigating circuit element; and
indicating whether a design rule is violated according to the determining.

15. The method of claim 14, further comprising:
calculating an area of the region of p-type substrate separating the n-well and the storage element;
determining a percentage of the area that is occupied by mitigating circuit elements; and
comparing the percentage with a minimum required percentage;
wherein indicating whether the design rule is violated further depends upon comparing the percentage with the minimum required percentage.

16. The method of claim 15, wherein the mitigating circuit elements include a p-type substrate tap.

17. The method of claim 15, wherein the mitigating circuit elements include an n-type MOS transistor.

18. The method of claim 14, further comprising:
calculating a width of the n-well; and
comparing the width of the n-well to a maximum width requirement;
wherein indicating whether the design rule is violated further depends upon comparing the width of the n-well to the maximum width requirement.

* * * * *